United States Patent
Baumann et al.

(10) Patent No.: US 8,354,216 B2
(45) Date of Patent: Jan. 15, 2013

(54) NEGATIVE-WORKING IMAGING ELEMENTS AND METHODS OF USE

(75) Inventors: Harald Baumann, Osterode/Harz (DE); Udo Dwars, Herzberg/Harz (DE); Christopher D. Simpson, Osterode (DE); Bernd Strehmel, Berlin (DE); Michael Flugel, Osterode/Harz (DE)

(73) Assignee: Eastman Kodak Company, Rochester, NY (US)

( * ) Notice: Subject to any disclaimer, the term of this patent is extended or adjusted under 35 U.S.C. 154(b) by 707 days.

(21) Appl. No.: 12/173,220

(22) Filed: Jul. 15, 2008

(65) Prior Publication Data

US 2010/0015556 A1   Jan. 21, 2010

(51) Int. Cl.
*B41F 7/00* (2006.01)
*G03F 7/00* (2006.01)

(52) U.S. Cl. .................. 430/270.1; 430/273.1; 430/302; 101/450.1; 101/453; 101/463.1

(58) Field of Classification Search ............... 430/270.1, 430/273.1, 302
See application file for complete search history.

(56) References Cited

U.S. PATENT DOCUMENTS

| | | | | |
|---|---|---|---|---|
| 3,203,802 | A | * | 8/1965 | Burg ........................ 430/271.1 |
| 4,053,317 | A | | 10/1977 | Naka et al. |
| 4,210,493 | A | | 7/1980 | Stewart et al. |
| 5,407,783 | A | * | 4/1995 | Caruso ....................... 430/288.1 |
| 5,589,306 | A | | 12/1996 | Takahashi et al. |
| 2006/0078819 | A1 | * | 4/2006 | Baumann et al. .......... 430/270.1 |
| 2007/0269739 | A1 | | 11/2007 | Nguyen et al. |
| 2008/0070152 | A1 | | 3/2008 | Yu et al. |

FOREIGN PATENT DOCUMENTS

| | | |
|---|---|---|
| EP | 0 765 856 A1 | 4/1997 |
| EP | 0 985 683 | 3/2000 |
| EP | 1 048 982 | 10/2002 |
| EP | 1 466 893 | 10/2004 |
| EP | 1 621 337 A1 | 2/2006 |
| EP | 1621337 A1 * | 2/2006 |
| EP | 1 035 435 | 8/2006 |
| EP | 1 708 025 | 10/2006 |
| EP | 1 783 548 A2 | 5/2007 |
| EP | 1783548 A2 * | 5/2007 |
| WO | WO 89/10343 | 11/1989 |
| WO | 99/20584 | 4/1999 |
| WO | WO 03/102959 A1 | 12/2003 |
| WO | 2005/029190 | 3/2005 |
| WO | 2008/000452 | 1/2008 |

\* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

Negative-working imageable elements such as lithographic printing plate precursors, include a free-radically polymerizable component, an initiator composition that is capable of generating free radicals sufficient to initiate polymerization of the free-radically polymerizable component upon exposure to imaging radiation in the presence of a radiation absorbing compound, a radiation absorbing compound, an aerobic free radical inhibitor, optionally a polymeric binder that is not a free radically polymerizable component, and an anaerobic free radical inhibitor. The molar ratio of the anaerobic free radical inhibitor to the aerobic free radical inhibitor is at least 1:1. This combination of inhibitors provides increased shelf life and good latent image stability particularly when the element includes a polymeric topcoat layer that functions as an oxygen barrier.

18 Claims, No Drawings

NEGATIVE-WORKING IMAGING ELEMENTS AND METHODS OF USE

FIELD OF THE INVENTION

This invention provides negative-working imageable elements that can be used for preparing lithographic printing plates. The imageable elements of this invention contain a certain combination of aerobic and anaerobic inhibitors that provide improved shelf life and good latent image stability.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise at least one imageable layer applied over the hydrophilic surface of a substrate. The imageable layer(s) include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged (exposed) regions are removed, the element is considered as positive-working. Conversely, if the non-imaged (non-exposed) regions are removed, the element is considered as negative-working. In each instance, the regions of the imageable layer (that is, the image areas) that remain are ink-receptive, and the regions of the hydrophilic surface revealed by the developing process accept water or a fountain solution and repel ink.

Direct digital imaging has become increasingly important in the printing industry. Imageable elements for the preparation of lithographic printing plates have been developed for use with infrared lasers.

Negative-working imageable elements useful for making lithographic printing plates are described in numerous publications including U.S. Patent Application Publications 2008/70152 (J. Yu et al.) and 2007/269739 (Nguyen et al.).

Some of these imageable elements are designed to have an oxygen barrier or topcoat layer disposed over the imageable layer. WO 2005/029190 (Gries et al.) describes the use of topcoat layers composed of poly(vinyl alcohol) having a high degree of saponification.

EP Publication 1,708,025 (Arimura et al.) describes negative-working lithographic printing plate precursors N-nitroso-N-phenyl hydroxylamine.

PROBLEM TO BE SOLVED

While there are a number of commercially useful negative-working lithographic printing plate precursors in the market and many others described in the patent literature, there is a need to improve shelf life, latent image keeping, photospeed, and other desired properties in such elements, especially when such elements have a topcoat layer comprised of poly(vinyl alcohol) as the primary component.

SUMMARY OF THE INVENTION

This invention provides a negative-working imageable element comprising a substrate and having thereon an imageable layer comprising:
   a free-radically polymerizable component,
   an initiator composition that is capable of generating free radicals sufficient to initiate polymerization of the free-radically polymerizable component upon exposure to imaging radiation in the presence of a radiation absorbing compound,
   a radiation absorbing compound,
   optionally a polymeric binder that is not a free radically polymerizable component,
   an aerobic free radical inhibitor,
   an anaerobic free radical inhibitor,
   wherein the molar ratio of the anaerobic free radical inhibitor to the aerobic free radical inhibitor is at least 1:1.

This invention also provides a method of making an image comprising:
   A) imagewise exposing the negative-working imageable element of this invention to imaging radiation to provide both exposed and non-exposed regions in the imageable layer, and
   B) applying a processing solution to the imaged element to remove predominantly only the non-exposed regions.

For example, this method can be used to provide a lithographic printing plate from a negative-working printing plate precursor having an aluminum-containing substrate.

The imageable elements of this invention exhibit a number of advantages including improved shelf life, latent image stability, long run length, and high image resolution. These features are provided by the inclusion of an inhibitor composition in the imageable layer. This inhibitor composition includes at least one aerobic free radical inhibitor and at least one anaerobic free radical inhibitor.

DETAILED DESCRIPTION OF THE INVENTION

Definitions

Unless the context indicates otherwise, when used herein, the terms "imageable element", "lithographic printing plate precursor" and "negative-working lithographic printing plate precursor" are meant to be references to embodiments of the present invention.

In addition, unless the context indicates otherwise, the various components described herein such as "primary polymeric binder", "secondary polymeric binder", "free-radically polymerizable component", "initiator", "radiation absorbing compound", "IR dye", "aerobic free radical inhibitor", and "anaerobic free radical inhibitor", and similar terms also refer to mixtures of such components. Thus, the use of the article "a" or "an" is not necessarily meant to refer to only a single component.

By the term "remove predominantly only said non-exposed regions" during development, we mean that the non-exposed regions of the imageable layer and the corresponding regions of any underlying layers are selectively and preferentially removed by the processing solution, but not the exposed regions to any significant extent (there may be insubstantial removal of the exposed regions).

By "computer-to-press", we mean the imaging means is carried out using a computer-directed imaging means (such as a laser) directly to the imageable layers without using masking or other intermediate imaging films.

Unless otherwise indicated, percentages refer to percents by dry weight, either the dry solids of a layer composition or formulation, or the dry coated weight of a layer (for example, imageable layer or topcoat layer). Unless otherwise indicated, the weight percent values can be interpreted as for either a layer formulation or a dried layer coating.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The present invention is used primarily to provide lithographic printing plates that can be used in lithographic printing operations as described in more detail below. However, other imageable elements of the invention can be used for other purposes as one skilled in the art would understand from the teaching provided herein. In general, the imageable elements comprise a substrate, an imageable layer, and in many embodiments, a topcoat layer or outermost oxygen-barrier layer disposed over the imageable layer.

Substrate

The imageable elements are formed by suitable application of an imageable layer formulation or composition onto a suitable substrate. This substrate can be an untreated or uncoated support but it is usually treated or coated in various ways as described below to provide a highly hydrophilic surface prior to application of the imageable layer composition. The substrate comprises a support that can be composed of any material that is conventionally used to prepare lithographic printing plate precursors. The substrate can be treated to provide an "interlayer" for improved adhesion or hydrophilicity, and the inner layer formulation is applied over the interlayer.

The substrate is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A useful substrate is composed of an aluminum-containing support that may be coated or treated using techniques known in the art, including physical graining, electrochemical graining, chemical graining, and anodizing. For example, the aluminum sheet can be anodized using phosphoric acid or sulfuric acid using conventional procedures.

An optional interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid-acrylic acid copolymer, poly(acrylic acid), or (meth)acrylic acid copolymer, or mixtures thereof. For example, the grained and/or sulfuric acid-anodized aluminum support can be treated with poly(phosphonic acid) using known procedures to improve surface hydrophilicity to provide a lithographic hydrophilic substrate.

The thickness of the substrate can be varied but should be sufficient to sustain the wear from printing and thin enough to wrap around a printing form. Such embodiments typically include a treated aluminum foil having a thickness of from about 100 to about 600 µm.

The backside (non-imaging side) of the substrate may be coated with antistatic agents and/or slipping layers or a matte layer to improve handling and "feel" of the imageable element.

The substrate can also be a cylindrical surface having the imageable layers applied thereon, and thus be an integral part of the printing press or a sleeve that is incorporated onto a press cylinder. The use of such imaged cylinders is described for example in U.S. Pat. No. 5,713,287 (Gelbart).

Imageable Layer Composition

The imageable layer used in the lithographic printing plate precursors is generally composed of a radiation-sensitive composition having several components and arranged in an imageable layer. For example, the radiation-sensitive composition (and imageable layer) comprises one or more free radically polymerizable components, each of which contains one or more free radically polymerizable groups that can be polymerized using free radical initiation. For example, such free radically polymerizable components can include one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having free radically polymerizable groups can also be used, and such polymers may also serve as polymeric binders in the imageable layer. In addition, mixtures of a free radically polymerizable polymeric binder and a free radically polymerizable monomer or oligomer can be used.

Suitable ethylenically unsaturated compounds that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the secondary free radically polymerizable component comprises carboxy groups.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Free radically polymerizable compounds include those derived from urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), Sartomer 415 [ethoxylated (20) trimethylolpropane triacrylate], Sartomer 480 [ethoxylated (10) bisphenol A dimethacrylate], and Sartomer 499 [ethoxylated (6) trimethylolpropane triacrylate] that are available from Sartomer Company, Inc.

Numerous other free radically polymerizable compounds are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (noted above), beginning with paragraph [0170], and in U.S. Pat. Nos. 6,309,792 (Hauck et al.), 6,569,603 (Furukawa), and 6,893,797 (Munnelly et al.).

Other useful free radically polymerizable components include those described in copending and commonly assigned U.S. Ser. No. 11/949,810 (filed Dec. 4, 2007 by Bauman, Dwars, Strehmel, Simpson, Savariar-Hauck, and Hauck) that include 1H-tetrazole groups. This copending application is incorporated herein by reference with respect to these components.

In addition to, or in place of the free radically polymerizable components described above, the imageable layer (and IR radiation-sensitive composition) may include polymeric materials that include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule. The free radically polymerizable groups (or ethylenically unsaturated groups) can be part of aliphatic or aromatic acrylate side chains attached to the polymeric backbone. Generally, there are at least 2 and up to 20 such groups per molecule, or typically from 2 to 10 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

Useful commercial products that comprise polymers that can be used in this manner include Bayhydrol® UV VP LS 2280, Bayhydrol® UV VP LS 2282, Bayhydrol® UV VP LS 2317, Bayhydrol® UV VP LS 2348, and Bayhydrol® UV XP 2420, that are all available from Bayer Material Science, as well as Laromer™ LR 8949, Laromer™ LR 8983, and Laromer™ LR 9005, that are all available from BASF.

The free radically polymerizable component can be present in the radiation-sensitive composition (imageable layer) in an amount of at least 10 and up to and including 70% based on the total solids in the radiation sensitive composition, or the total dry weight of the imageable layer.

The radiation-sensitive composition (or imageable layer) also includes an initiator composition that is capable of generating free radicals sufficient to initiate polymerization of all the various free radically polymerizable components upon exposure of the composition to imaging radiation, and in the presence of a suitable radiation absorbing compound (described below). The initiator composition is generally responsive to electromagnetic imaging radiation in the ultraviolet, visible, infrared, or near infrared spectral regions, corresponding to the spectral range of at least 150 nm and up to and including 1500 nm. For example, they can be responsive to infrared radiation of at least 700 nm and up to and including 1400 nm (for example from about 750 to about 1250 nm). Other initiator compositions are responsive to "violet" radiation of from about 250 to about 475 nm. Initiator compositions are used that are appropriate for the desired imaging wavelength(s).

In general, suitable initiator compositions comprise compounds that include but are not limited to, amines (such as alkanol amines), thiol compounds, anilinodiacetic acids or derivatives thereof, N-phenyl glycine and derivatives thereof, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, alkyltriarylborates, trihalogenomethylarylsulfones, benzoin ethers and esters, triaryloxazoles, coumarins, stilbenzyl derivatives, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). Other known initiator composition components are described for example in U.S. Patent Application Publication 2003/0064318 (noted above).

Co-initiators can also be used, such as metallocenes (such as titanocenes and ferrocenes), polycarboxylic acids, haloalkyl triazines, thiols, or mercaptans (such as mercaptotriazoles), borate salts, and photooxidants containing a heterocyclic nitrogen that is substituted by an alkoxy or acyloxy group, as described in U.S. Pat. No. 5,942,372 (West et al.).

In some embodiments, useful initiator compositions include a combination of a 2,4,5-triarylimidazolyl dimer and a thiol compound such as either 2,2'-bis(o-chlorophenyl)-4, 4',5,5'-tetraphenylbiimidazole or 2,2'-bis(o-chlorophenyl)-4, 4',5,5'-tetra(m-methoxyphenyl)biimidazole in combination with a thiol compound such as a mercaptotriazole.

Useful radiation-sensitive compositions include an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. Nos. 5,086,086 (Brown-Wensley et al.), 5,965,319 (Kobayashi), and 6,051,366 (Baumann et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N≡N⁺). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

The halonium salts are useful such as the iodonium salts. In one embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Useful boron-containing compounds include organic boron salts that include an organic boron anion such as those described in the noted U.S. Pat. No. 6,569,603 that is paired with a suitable cation such as an alkali metal ion, an onium, or a cationic sensitizing dye. Useful onium cations for this purpose include but are not limited to, ammonium, sulfonium, phosphonium, iodonium, and diazonium cations. Iodonium salts such as iodonium borates are useful as initiator compounds in radiation-sensitive compounds that are designed for "on-press" development (described in more detail below). They may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. Useful mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2,4-triazole.

Examples of other useful initiator compositions are described for example in EP 1,182,033 (Fujimaki et al.) and in U.S. Pat. Nos. 6,352,812 (Shimazu et al.) and 6,893,797 (Munnelly et al.).

One class of useful iodonium cations include diaryliodonium cations that are represented by the following Structure (IB):

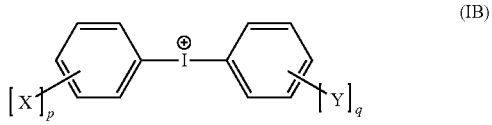

(IB)

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, isopropoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Typically, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated but the "symmetric" compounds are preferred (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but typically they are at the 2- or 4-positions on either or both phenyl rings.

Despite what type of X and Y groups are present in the iodonium cation, the sum of the carbon atoms in the X and Y substituents generally is at least 6, and typically at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure IB, p and q are independently 0 or integers of 1 to 5, provided that either p or q is at least 1. Typically, both p and q are at least 1, or each of p and q is 1. Thus, it is understood that the carbon atoms in the phenyl rings that are not substituted by X or Y groups have a hydrogen atom at those ring positions.

Useful boron-containing anions are organic anions having four organic groups attached to the boron atom. Such organic anions can be aliphatic, aromatic, heterocyclic, or a combination of any of these. Generally, the organic groups are substituted or unsubstituted aliphatic or carbocyclic aromatic groups. For example, useful boron-containing anions can be represented by the following Structure (IB$_Z$):

(IBz)

wherein R₁, R₂, R₃, and R₄ are independently substituted or unsubstituted alkyl groups having 1 to 12 carbon atoms (such as methyl, ethyl, n-propyl, isopropyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazolyl, indolyl, quinolinyl, oxadiazolyl, and benzoxazolyl groups). Alternatively, two or more of R₁, R₂, R₃, and R₄ can be joined together to form a heterocyclic ring with the boron atom, such rings having up to 7 carbon, nitrogen, oxygen, or nitrogen atoms. None of the R₁ through R₄ groups contains halogen atoms and particularly fluorine atoms.

Typically, R₁, R₂, R₃, and R₄ are independently substituted or unsubstituted alkyl or aryl groups as defined above, and more typically, at least 3 of R₁, R₂, R₃, and R₄ are the same or different substituted or unsubstituted aryl groups (such as substituted or unsubstituted phenyl groups). For example, all of R₁, R₂, R₃, and R₄ can be the same or different substituted or unsubstituted aryl groups, or all of the groups are the same substituted or unsubstituted phenyl group. Z⁻ can be a tetraphenyl borate wherein the phenyl groups are substituted or unsubstituted (for example, all are unsubstituted phenyl groups).

Some representative iodonium borate compounds include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-4'-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis(penta-fluorophenyl)borate, 4-methylphenyl-4'-dodecylphenyliodonium tetrakis(4-fluorophenyl)borate, bis(dodecylphenyl)iodonium tetrakis(pentafluorophenyl)-borate, and bis(4-t-butylphenyl)iodonium tetrakis(1-imidazolyl)borate.

Mixtures of two or more of these compounds can also be used in the iodonium borate initiator composition.

Such diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry,* 37, 4241-4254 (1999), both of which are incorporated herein by reference.

The boron-containing anions can also be supplied as part of infrared radiation absorbing dyes (for example, cationic dyes) as described below. Such boron-containing anions generally are defined as described above with Structure (IBz).

The free radical generating compounds in the initiator composition are generally present in the radiation-sensitive composition (or imageable layer) in an amount of at least 0.5% and up to and including 30%, and typically at least 2 and up to and including about 20%, based on composition total solids or total dry weight of the imageable layer. The optimum amount of the various initiator components may differ for various compounds and the sensitivity of the radiation-sensitive composition that is desired and would be readily apparent to one skilled in the art.

The imageable element also includes one or more imaging radiation absorbing compounds (or chromophores or sensitizers) that spectrally sensitize the composition to a desired wavelength. In some embodiments, this imparted sensitivity is at a $\lambda_{max}$ of from about 250 nm and up to and 500 nm, typically from about 250 to about 475 nm and more typically from about 390 to about 430 nm. For example, useful sensitizers for these wavelengths include but are not limited to compounds having the following Formula:

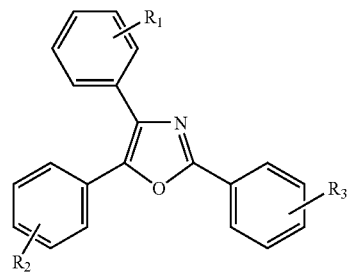

wherein R₁, R₂ and R₃ independently represent a hydrogen atom, alkyl, aryl or aralkyl group that may be substituted, an —NR₄R₅-group (R₄ and R₅ representing an alkyl, aryl or aralkyl group), or —OR₆ group (R₆ representing an alkyl, aryl or aralkyl group). Particularly useful compounds of this Formula contain at least one of substituent R₁, R₂, and R₃ that represents a donor group, such as an amino group (for example, an dialkylamino group). Useful compounds of this type are described in WO 2004/074930 (Baumann et al.). These compounds can be made following the procedure given in DE 1,120,875 (Sues et al.) and EP 129,059 (Hayashida).

Other embodiments include infrared radiation absorbing compounds ("IR absorbing compounds") that generally absorb radiation at a $\lambda_{max}$ of from about 700 to about 1400 nm and typically from about 750 to about 1250 nm with minimal absorption at 300 to 600 nm.

Examples of suitable IR dyes include but are not limited to, azo dyes, squarylium dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. Nos. 4,973,572 (DeBoer), 5,208,135 (Patel et al.), 5,244,771 (Jandrue Sr. et al.), and 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S. Patent Application Publication 2005-0130059 (Tao). A general description of one class of suitable cyanine dyes is shown by the formula in paragraph 0026 of WO 2004/101280 (Munnelly et al.).

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (Hauck et al.), 6,264,920 (Achilefu et al.), 6,153,356 (Urano et al.), and 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The radiation absorbing compound is generally present in the imageable element in an amount of at least 0.5% and up to 30 weight % and typically from about 3 to about 25 weight % (based on total dry layer weight). The particular amount needed for this purpose would be readily apparent to one skilled in the art.

The primary polymeric binder useful in the radiation-sensitive composition (and imageable layer) are generally polymers having a hydrophobic backbone that comprises recurring units derived from one or more different ethlenically unsaturated polymerizable monomers. The primary polymeric binder can also serve as a free radically polymerizable component, or the imageable layer can have a mixture of polymeric binders, some of which are free radically polymerizable components and some that are not.

The imageable layer can comprise one or more polymeric binders that are particulate in nature. Such polymeric binders can be present in the radiation-sensitive composition (or imageable layer) in particulate form, meaning that they exist at room temperature as discrete particles, for example in an aqueous dispersion. However, the particles can also be partially coalesced or deformed, for example at temperatures used for drying coated imageable layer formulations. Even in this environment, the particulate structure is not destroyed. The average particle size is generally from about 30 to about 2000 nm and typically the average particle size is from about 60 to about 1000 nm or from about 60 to about 500 nm. The particulate primary polymeric binder is generally obtained commercially and used as an aqueous dispersion having at least 20% and up to 50% solids.

As noted above, the polymeric binders can be free radically polymerizable polymeric binders. These polymeric binders can be "self-crosslinkable", by which we mean that a separate non-polymeric free radically polymerizable component is not necessary, but can also be present if desired. Such binders have a backbone comprising multiple (at least two) urethane moieties. In some embodiments, there are at least two of these urethane moieties in each backbone recurring unit. Such polymeric binders also include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule.

The free radically polymerizable groups (or ethylenically unsaturated groups) can be part of aliphatic or aromatic acrylate side chains attached to the polymeric backbone. Generally, there are at least 2 and up to 20 such groups per molecule, or typically from 2 to 10 such groups per molecule.

The primary polymeric binders can also comprise hydrophilic groups including but not limited to, carboxy, sulfo, or phospho groups, either attached directly to the backbone or attached as part of side chains other than the free radically polymerizable side chains. In most embodiments, the hydrophilic groups, such as carboxy groups, are directly attached to the backbone.

Useful commercial products that comprise polymeric binders useful in this invention include but are not limited to, Bayhydrol® UV VP LS 2280, Bayhydrol® UV VP LS 2282, Bayhydrol® UV VP LS 2317, Bayhydrol® UV VP LS 2348, and Bayhydrol® UV XP 2420, that are all available from Bayer Material Science, as well as Laromer™ LR 8949, Laromer™ LR 8983, and Laromer™ LR 9005, that are all available from BASF.

Other useful polymeric binders that are particulate in form include poly(urethane-acrylic) hybrids. This hybrid has a molecular weight of from about 50,000 to about 500,000. These hybrids can be either "aromatic" or "aliphatic" in nature depending upon the specific reactants used in their manufacture. Blends of particles of two or more poly(urethane-acrylic) hybrids can also be used. For example, a blend of Hybridur® 570 polymer dispersion with Hybridur® 870 polymer dispersion could be used.

Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly (urethane-acrylic) hybrid particles. These dispersions generally include at least 30% solids of the poly(urethane-acrylic)

hybrid particles in a suitable aqueous medium that may also include commercial surfactants, anti-foaming agents, dispersing agents, anti-corrosive agents, and optionally pigments and water-miscible organic solvents. Further details about commercial Hybridur® polymer dispersions can be obtained by visiting the Air Products and Chemicals, Inc. website.

Still other useful particulate polymeric binders are polymers having polyalkylene oxide segments [such as poly(ethylene)oxide and poly(propylene)oxide segments] as described for example in U.S. Pat. Nos. 6,899,994 (Huang et al.) and 7,261,998 (Hayashi et al.) that are incorporated herein by reference for specific details about such polymers and methods of preparing them. Particular details of such polymeric binders are provided in Columns 6-13 of the noted Huang et al. patent and Columns 7-13 of the noted Hayashi et al. patent.

In general, such polymeric binders can be graft copolymers comprising a main chain polymer and polyalkylene oxide side chains, a block copolymer having at least one polyalkylene oxide block and at least one non-polyalkylene oxide block, and a combination thereof. For example, the graft copolymers can include recurring units having pendant -Q-W-Y groups wherein Q is a divalent linking group, W is either a hydrophilic or hydrophobic segment, and Y is a hydrophilic or hydrophobic segment with the proviso that when W is a hydrophilic segment, Y is either a hydrophobic or hydrophilic segment, and further that when W is a hydrophobic segment, Y is a hydrophilic segment. Such polymeric binders can also have additional recurring units that have pendant, alkyl, halogen, cyano, acyloxy, alkoxy, alkoxycarbonyl, hydroxyalkyloxy-carbonyl, acyl, aminocarbonyl, or aryl groups, as described in more detail in the noted patent of Huang et al. The cyano pendant groups are particularly useful.

The polymeric binders may be homogenous, that is, dissolved in the coating solvent. Such polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033A1 (Fujimaki et al.) and U.S. Pat. Nos. 6,309,792 (Hauck et al.), 6,352,812 (Shimazu et al.), 6,569,603 (Furukawa et al.), and 6,893,797 (Munnelly et al.). Also useful are the vinyl carbazole polymers described in U.S. Pat. No. 7,175,949 (Tao et al.), and the polymers having pendant vinyl groups as described in U.S. Pat. No. 7,279,255 (Tao et al.), both incorporated herein by reference. Copolymers of polyethylene glycol methacrylate/acrylonitrile/styrene in particulate form, dissolved copolymers derived from carboxyphenyl methacrylamide/acrylonitrile/methacrylamide/N-phenyl maleimide, copolymers derived from polyethylene glycol methacrylate/acrylonitrile/vinyl carbazole/styrene/methacrylic acid, copolymers derived from N-phenyl maleimide/methacrylamide/methacrylic acid, copolymers derived from urethane-acrylic intermediate A (the reaction product of p-toluene sulfonyl isocyanate and hydroxyl ethyl methacrylate)/acrylonitrile/N-phenyl maleimide, and copolymers derived from N-methoxymethyl methacrylamide/methacrylic acid/acrylonitrile/n-phenylmaleimide are useful.

The polymeric binder can be present in the radiation-sensitive composition in an amount of from about 25 to about 80%, based on the total composition (or imageable layer) dry weight.

The inhibitor composition includes one or more aerobic free radical inhibitors that can function as an inhibitor in a free radical polymerizable composition only in the presence of oxygen. These inhibitors have a low inhibiting efficiency in the absence of oxygen. Typical representatives of aerobic free radical inhibitors include phenolic compounds such as phenols including sterically hindered phenols. Examples include but are not limited to, hydroquinone, 4-methoxyphenol (MEHQ), 2,6-di-tert-butyl-4-methylphenol (BHT), 4,4'-bis (2,6-di-tert-butylphenol), 1,3,5-trimethyl-2,4,6-tris(3,5-di-tert-butyl-4-hydroxybenzyl)-benzene, and 3,5-di-tert-butyl-1,2-benzenediol. In the case of phenolic aerobic free radical inhibitors, the low efficiency of inhibiting the radical polymerization can be explained by the lack of reaction of polymer radicals with the inhibitor but by the fast reaction of the phenols with peroxy radicals formed by reaction of polymer radicals with oxygen. When radiation-sensitive compositions are stabilized by only aerobic free radical inhibitors, a certain level of oxygen concentration is needed to guarantee the required shelf life of the composition or imageable element. Thus, in the case of lithographic printing plate precursors that have an oxygen barrier topcoat layer, the permeability of the topcoat layer should be not too low resulting in a limited stability of the latent image formed after exposure. Radiation-sensitive compositions with high latent image keeping can not be made with aerobic free radical inhibitors alone because especially at high temperature conditions (for example, during drying after coating, inappropriate transporting or during preheat before development) the compositions tend to polymerize without exposure resulting in insufficient shelf life.

The inhibitor composition also includes one or more anaerobic free radical inhibitors that function best in the absence of oxygen because they are able to react directly with the free radicals. Useful compounds of this type include nitroso compounds (both N- and C-nitroso), N-oxides, and hydroxylamine derivatives. Typical examples include but are not limited to:

C-nitroso compounds such as $C_4$ to $C_{10}$ nitroso alkanes (for example, t-nitrosobutane and t-nitrosooctane), aromatic C-nitroso compounds (for example, nitrosobenzene, 2-nitrosotoluene, nitrosodurene, 4-nitrosophenol, 1-nitroso-2-naphthole, 2-nitroso-1-naphthole, 4-nitrosodiphenylamine, 3,5-dibromo-4-nitrosobenzenesulfonic acid or salt, and 2-methyl-2-nitrosopropane dimer).

N-nitroso-compounds such as N-nitroso-N-phenyl hydroxylamine and their complexes with cations ([PhN(NO)O]$_m$M1 wherein M1 is ammonium ion, or metal ions of the $3^{rd}$-$6^{th}$ period elements of the Groups I-VIII of the Periodic Table, and m is 1 to 4), N-nitrosodiphenylamine, N-nitrosopyrrolidine, N-t-butyl-N-nitrosoaniline, N-nitrosodimethylamine, N-nitrosodiethylamine, 1-(aminocarbonyl)-1-methyl-2-oxohydrazine, 1-nitrosopiperidine, 4-nitrosomorpholine, N-nitroso-N-methylbutylamine, N-nitroso-N-ethylurea, and N-nitrosohexamethyleneimine.

N-oxides such as 5,5-dimethyl-1-pyrroline N-oxide, α-(4-pyridyl N-oxide)-N-t-butylnitrone, N-t-butyl-α-phenylnitrone, and 3,3,5,5-tetramethyl-1-pyrroline N-oxide.

Hydroxylamine derivatives such as 1-hydroxy-2,2,6,6-tetramethyl-4-piperidone.

The N-nitroso compounds are particularly useful, including N-nitroso-N-phenyl hydroxylamine and their aluminum or sodium complexes.

The concentrations of each of the aerobic and anaerobic free radical inhibitors in the radiation-sensitive composition or imageable layer are independently from about 0.001 to about 2 weight %, or from about 0.003 to about 0.5 weight % based on the total dry weight. The molar ratio of the aerobic free radical inhibitor to the anaerobic free radical inhibitor is from about 1:1 to about 200:1.

The aerobic and anaerobic free radical inhibitors can be obtained from various commercial sources.

The imageable layer (radiation-sensitive composition) can further comprise one or more phosphate (meth)acrylates, each of which has a molecular weight generally greater than 200 and typically at least 300 and up to and including 1000. By "phosphate (meth)acrylate" we also mean to include "phosphate methacrylates" and other derivatives having substituents on the vinyl group in the acrylate moiety. Such compounds and their use in imageable layers are described in more detail in U.S. Pat. No. 7,175,969 (Ray et al.) that is incorporated herein by reference. These compounds can be anionic or nonionic in nature.

Representative phosphate (meth)acrylates include but are not limited to, ethylene glycol methacrylate phosphate (available from Aldrich Chemical Co.), a phosphate of 2-hydroxyethyl methacrylate that is available as Kayamer PM-2 from Nippon Kayaku (Japan), a phosphate of a di(caprolactone modified 2-hydroxyethyl methacrylate) that is available as Kayamer PM-21 (Nippon Kayaku, Japan), and a polyethylene glycol methacrylate phosphate with 4-5 ethoxy groups that is available as Phosmer M, Phosmer MH, Phosmer PE, Phosmer PEH, Phosmer PP. and Phosmer PPH from Uni-Chemical Co., Ltd. (Japan).

The phosphate (meth)acrylate can be present in the radiation-sensitive composition (imageable layer) in an amount of at least 0.5 and up to and including 20% and typically at least 0.9 and up to and including 10%, based on total dry composition weight.

The imageable layer can also include a "primary additive" that is a poly(alkylene glycol) or an ether or ester thereof that has a molecular weight of at least 200 and up to and including 4000. This primary additive can be present in an amount of at least 2 and up to and including 50 weight %, based on the total dry weight of the imageable layer. Useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are Sartomer SR9036 (ethoxylated (30) bisphenol A dimethacrylate), CD9038 (ethoxylated (30) bisphenol A diacrylate), SR399 (dipentaerythritol pentaacrylate), and Sartomer SR494 (ethoxylated (5) pentaerythritol tetraacrylate), and similar compounds all of which that can be obtained from Sartomer Company, Inc. In some embodiments, the primary additive may be "non-reactive" meaning that it does not contain polymerizable vinyl groups.

The imageable layer can also include a "secondary additive" that is a poly(vinyl alcohol), a poly(vinyl pyrrolidone), poly(vinyl imidazole), or polyester in an amount of up to and including 20 weight % based on the total dry weight of the imageable layer.

The imageable layer can also include a variety of optional compounds including but not limited to, colorants and colorant precursors, color developers, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

The radiation-sensitive composition can be applied to a substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the radiation-sensitive composition is applied and dried to form an imageable layer and a topcoat layer formulation can be applied to that layer.

Illustrative of such manufacturing methods is mixing the radically polymerizable component, primary polymeric binder, initiator composition, radiation absorbing compound, and any other components of the radiation-sensitive composition in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described in the Examples below. After proper drying, the coating weight of the imageable layer is generally at least 0.1 and up to and including 5 $g/m^2$ or at least 0.5 and up to and including 3.5 $g/m^2$.

Layers can also be present under the imageable layer to enhance developability or to act as a thermal insulating layer. The underlying layer should be soluble or at least dispersible in the developer and typically have a relatively low thermal conductivity coefficient.

Topcoat Layer

The imageable element generally includes what is conventionally known as an overcoat or topcoat layer (such as an oxygen impermeable topcoat) applied to and disposed over the imageable layer for example, as described in WO 99/06890 (Pappas et al.). Such topcoat layers comprise one or more water-soluble polymer binders chosen from such polymers as poly(vinyl alcohol)s, poly(vinyl pyrrolidone), poly(ethyleneimine), poly(vinyl imidazole), and copolymers of two or more of vinyl pyrrolidone, ethyleneimine, and vinyl imidazole, and generally have a dry coating weight of at least 0.1 and up to and including 4 $g/m^2$ (typically from about 0.1 to about 2.5 $g/m^2$) in which the water-soluble polymer(s) comprise at least 50% and up to 98% of the dry weight of the topcoat layer. Topcoat layer polymer binders are also described in U.S. Pat. Nos. 3,458,311 (Alles), 4,072,527 (Fanni), and 4,072,528 (Bratt), and EP Publications 275,147A2 (Wade et al.), 403,096A2 (Ali), 354,475A2 (Zertani et al.), 465,034A2 (Ueda et al.), and 352,630A2 (Zertani et al.).

In many embodiments, the topcoat layer comprises one or more poly(vinyl alcohol)s as the predominant polymeric binders, each of which has a hydrolysis level of at least 75%, typically from about 85 and to about 99% and more typically from about 88 to about 98%. By "hydrolysis level", we are referring to the specific percentage of acetate moieties in the polymer having been converted to hydroxyl groups. Thus, vinyl acetate is polymerized to form poly(vinyl acetate) and a hydroxide (usually sodium or potassium hydroxide) is used to convert acetate groups to hydroxyl groups.

While the poly(vinyl alcohol)s described above can comprise up to 100% of the total overcoat dry weight, usually, they comprise at least 60 and up to 95% of the total topcoat layer dry weight. In such embodiments, the topcoat layer thus can include up to 40 weight % of other components including but not limited to, other polymeric binders described above as well as cationic, anionic, and non-ionic wetting agents or surfactants, flow improvers or thickeners, antifoamants, colorants, particles such as aluminum oxide and silicon dioxide, and biocides. Details about such addenda are provided in WO 99/06890 (Pappas et al.).

For example, the topcoat layer can further comprise poly (vinyl pyrrolidone), a copolymer derived from vinyl pyrrolidone, poly(vinyl imidazole), a copolymer derived from vinyl imidazole, or a poly(ethylene imine) in an amount of from about 5 to about 40% based on the total topcoat layer dry weight.

The topcoat layer formulations can be prepared and applied in a similar fashion by dissolving or dispersing the desired components described above in suitable solvents or mixtures of solvents including but not limited to, water or water with one or more of iso-propanol, methanol, or other alcohols or ketones in an amount of up to 15 weight %. A surfactant may be included to improve coatability.

Intermediate drying steps may be used between applications of the various layer formulations to remove solvent(s) before coating other formulations. Drying steps at conventional times and temperatures may also help in preventing the mixing of the various layers.

Once the various layers have been applied and dried on the substrate, the imageable element can be enclosed in water-impermeable material that substantially inhibits the transfer of moisture to and from the imageable element as described in U.S. Pat. No. 7,175,969 (noted above) that is incorporated herein by reference.

The lithographic printing plate precursors can have any useful form including, but not limited to, flat plates, printing cylinders, printing sleeves (solid or hollow cores) and printing tapes (including flexible printing webs).

Lithographic printing plate precursors can be of any size or shape (for example, square or rectangular) having the requisite one or more imageable layers disposed on a suitable substrate. Printing cylinders and sleeves are known as rotary printing members having a substrate and at least one imageable layer in cylindrical form. Hollow or solid metal cores can be used as substrates for printing sleeves.

Imaging

During use, the lithographic printing plate precursors are exposed to a suitable source of imaging radiation at a wavelength of from about 300 to about 1500 nm and typically from about 350 to about 1250 nm. The lasers used for exposure are usually diode lasers, because of the reliability and low maintenance of diode laser systems, but other lasers such as gas or solid-state lasers may also be used. The combination of power, intensity and exposure time for laser imaging would be readily apparent to one skilled in the art.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the printing plate mounted to the interior or exterior cylindrical surface of the drum. Examples of useful infrared imaging apparatus are available as models of Kodak® Trendsetter imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image a precursor while it is attached to the printing plate cylinder. An example of a suitable direct imaging printing press includes the Heidelberg SM74-DI press (available from Heidelberg, Dayton, Ohio).

Useful UV and "violet" imaging apparatus (wavelength of about 405 nm) include Prosetter platesetters available from Heidelberger Druckmaschinen (Germany), Luxel Vx-9600 CTP and Luxel V-8 CTP platesetters available from Fuji Photo (Japan), Python platesetter (Highwater, UK), MakoNews, Mako 2, Mako 4, and Mako 8 platesetters available from ECRM (US), Micra platesetter available from Screen (Japan), Polaris and Advantage platesetters available from Agfa (Belgium), LaserJet platesetter available from Krause (Germany), and Andromeda® A750M platesetter available from Lithotech (Germany), Infrared imaging speeds may be in the range of from about 50 to about 1500 mJ/cm$^2$, and typically from about 75 to about 400 mJ/cm$^2$. Image radiation in the UV or "violet" region of the spectrum can be carried out generally using energies of at least 0.01 mJ/cm$^2$ and up to and including 0.5 mJ/cm$^2$ and typically at least 0.02 and up to and including 0.1 mJ/cm$^2$.

While laser imaging is useful in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Processing and Printing

Imaging of the lithographic printing plate precursor produces a lithographic printing plate that comprises a latent image of imaged (exposed) and non-imaged (non-exposed) regions.

With or without a post-exposure baking (or pre-heat) step after imaging and before processing, the imaged lithographic printing plate precursors can be processed "off-press" using a single processing solution as described below. Processing the imaged element with the processing solution is carried out for a time sufficient to remove predominantly only the non-exposed regions of the imageable layer and underlying portions of any underlayers, and to reveal the hydrophilic surface of the substrate, but not long enough to remove significant amounts of the exposed regions. Thus, the lithographic printing plate precursors are "negative-working". The revealed hydrophilic surface repels ink while the exposed (or imaged) regions accept ink. The non-imaged (non-exposed) regions of the imageable layer(s) are described as being "soluble" or "removable" in the processing solution because they are removed, dissolved, or dispersed within it more readily than the imaged (exposed) regions. Thus, the term "soluble" also means "dispersible". If the imaged element has a topcoat layer, it can be removed between imaging and processing (that is, between steps A and B).

With or without the need for a preheat step after imaging, the imaged elements can be developed "off-press" using conventional processing and an aqueous solution such as an aqueous developer.

The developer composition commonly includes surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the developer is generally from about 4 to about 14. The imaged elements are generally developed using conventional processing conditions. Aqueous alkaline developers and organic solvent-containing alkaline developers can be used.

Organic solvent-containing alkaline developers are generally single-phase solutions of one or more organic solvents that are miscible with water, and generally have a pH below 12. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight.

Representative organic solvent-containing alkaline developers include ND-1 Developer, 955 Developer, 956 Developer, 989 Developer, Developer 980, and 956 Developer (available from Eastman Kodak Company), HDN-1 Developer and LP-DS Developer (available from Fuji Photo), and EN 232 Developer and PL10 Developer (available from Agfa).

Useful aqueous alkaline developers generally have a pH of at least 7 and preferably of at least 11 and up to 13.5. Such developers include but are note limited to, 3000 Developer, 9000 Developer, Goldstar® Developer, Goldstar® Plus Developer, Goldstar® Premium Developer, GREENSTAR Developer, ThermalPro Developer, PROTHERM Developer, MX1813 Developer, and MX1710 Developer (all available from Eastman Kodak Company), as well as Fuji HDP7 Developer (Fuji Photo), and Energy CTP Developer (Agfa). These compositions also generally include surfactants, chelating agents (such as salts of ethylenediaminetetraacetic acid), and alkaline components (such as inorganic metasilicates, organic metasilicates, hydroxides, and bicarbonates).

Such alkaline developers can also include one or more "coating-attack suppressing agents" that are developer-soluble compounds that suppress developer attack of the outer layer. "Developer-soluble" means that enough of the agent(s) will dissolve in the developer to suppress attack by the developer. Mixtures of these compounds can be used. Typically, the coating-attack suppressing agents are developer-soluble polyethoxylated, polypropoxylated, or polybutoxylated compounds that include recurring —($CH_2$—$CHF_a$—O—)— units in which $R_a$ is hydrogen or a methyl or ethyl group. Each agent can have the same or different recurring units (in a random or block fashion). Representative compounds of this type include but are not limited to, polyglycols and polycondensation products having the noted recurring units. Examples of such compounds and representative sources, tradenames, or methods of preparing are described for example in U.S. Pat. No. 6,649,324 (Fiebag et al.) that is incorporated herein by reference.

In alternative embodiments, with or without a post-exposure baking step after imaging and before development, the imaged elements can be developed "off-press" using a gum (or gum solution) as described below. A gum solution is typically an aqueous liquid that comprises one or more surface protective compounds capable of protecting the lithographic image of the printing plate against contamination (for example, oxidation, fingerprints, dust or scratches). There are generally two types of "gum" solutions known in the art: (1) a "bake", "baking", or "pre-bake" gum usually contains one or more compounds that do not evaporate at the usual pre-bake temperatures used for making lithographic printing plates, typically an anionic or nonionic surfactant, and (2) a "finisher" gum that usually contains one or more hydrophilic polymers (both synthetic and naturally-occurring, such as gum Arabic cellulosic compounds, (meth)acrylic acid polymers, and polysaccharides) that are useful for providing a protective overcoat on a printing plate. The gums used in the practice of these embodiments would be generally considered "pre-bake" gums, and thus, usually lack the hydrophilic polymers.

Generally, after imaging for off-press processing, the processing solution is applied to the imaged precursor by rubbing, spraying, jetting, dipping, immersing, coating, or wiping the outer layer with the processing solution or contacting the imaged precursor with a roller, impregnated pad, or applicator containing the single processing solution. For example, the imaged element can be brushed with the processing solution, or the processing solution can be poured onto or applied by spraying the imaged surface with sufficient force to remove the exposed regions using a spray nozzle system as described for example in [0124] of EP 1,788,431A2 (noted above). Still again, the imaged element can be immersed in the processing solution and rubbed by hand or with an apparatus.

The processing solution can also be applied in a processing unit (or station) as a component of a suitable apparatus that has at least one roller for rubbing or brushing the precursor while the processing solution is applied. By using such a processing unit, the exposed regions of the imaged layer may be removed from the substrate more completely and quickly. Residual processing solution may be removed (for example, using a squeegee or nip rollers) or left on the resulting printing plate (and optionally dried) without any rinsing step. It is desirable that processing be carried out using processor systems and apparatus that allow the processing solution to reside on the imaged precursor for sufficient time of interaction between the processing solution and the precursor imaged coatings before mechanical means (such as brush or plush rollers) are used.

Excess processing solution can be collected in a tank and used several times, and replenished if necessary from a reservoir of "fresh" processing solution. A replenisher solution can be of the same concentration as that used during processing, it can be provided in concentrated form and diluted with water at an appropriate time, or it can be comprise of an entirely different composition. It may also be desirable to apply a "fresh" sample of the processing solution to each imaged lithographic printing plate precursor.

Generally, a developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals. These development processes can be carried out in suitable developing processors or equipment using standard residence times and recirculation and replenishment rates.

Following this off-press development, the imaged element can be rinsed with water and dried in a suitable fashion. The dried element can also be treated with a conventional gumming solution (preferably gum arabic). In addition, a postbake operation can be carried out, with or without a blanket exposure to UV or visible radiation. Alternatively, a post-UV floodwise exposure (without heat) can be used to enhance the performance of the imaged element.

The resulting lithographic printing plates can also be baked, after processing, in a postbake operation that can be carried out to increase run length. Baking can be carried out, for example, in a suitable oven at a temperature of less than 300° C. and typically at less than 250° C. for from about 2 to about 10 minutes. More typically, the baking is done very quickly at a temperature of from about 160° C. to about 220° C. (for example, at 190° C.) for up to five minutes (for example, up to two minutes). In some embodiments, the lithographic printing plates are postbaked at from about 160 to about 220° C. for up to two minutes Alternatively, the lithographic printing plates can be baked or cured by overall exposure to IR radiation at a wavelength of from about 800 to about 850 nm. This exposure creates conditions that enable very controllable baking effects with minimal distortion. For example, the lithographic printing plates can be passed through a commercial QuickBake 1250 oven (available from Eastman Kodak Company) at 4 feet (1.3 m) per minute at the 45% power setting of an infrared lamp to achieve a similar baking result from heating the plate in an oven at 200° C. for 2 minutes.

After off-press development, a lithographic ink and fountain solution can be applied to the printing surface of the lithographic printing plate for printing. The non-exposed regions of the outermost layer take up ink and the hydrophilic surface of the substrate revealed by the imaging and processing takes up the fountain solution. The ink is then transferred to a suitable receiving material (such as cloth, paper, metal, glass, or plastic) to provide one or more desired impressions of the image thereon. If desired, an intermediate "blanket" roller can be used to transfer the ink from the printing plate to the receiving material. The printing plates can be cleaned between impressions, if desired, using conventional cleaning means and chemicals.

With or without a post-exposure baking step after imaging and before development, the imaged elements also can be developed "on-press". In most on-press embodiments, a post-exposure baking step is omitted. The imaged element is mounted on press wherein the unexposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The fountain solution is taken up by the non-imaged regions, that is, the surface of the hydrophilic substrate, and ink is taken up by the imaged (non-removed) regions of the imaged layer. The ink is then transferred to a suitable receiving material as described above.

The following examples are presented to illustrate the practice of this invention but are not intended to be limiting in any manner.

EXAMPLES

Materials and Methods

The components and materials used in the examples and analytical methods were as follows. Unless otherwise indicated, the components can be obtained from various commercial sources such as Aldrich Chemical Co. (Milwaukee, Wis.).

| | |
|---|---|
| BHT | 2,6-Di-t-butyl-4-methyl-phenol |
| Desmodur ® N100 | Trifunctional isocyanate (biuret of hexamethylene diisocyanate), that is available from Bayer (Germany) |
| HEMA | (2-Hydroxyethyl)methacrylate |
| HEPi | 2-(2-Hydroxyethyl)piperidine |
| HMDI | Hexamethylene diisocyanate |
| Kayamer PM-2 | Ester of 1 mol phosphoric acid and 1.5 mol hydroxyethylmethacrylate that is available from Nippon Kayaku (Japan) |
| Lutensol ® TO10 | Ethoxylated i-C13-oxoalcohol (EO10), from BASF |
| MEHQ | 4-Methoxyphenol |
| Metolat ® 285 | Sodium salt of dioctyl sulfo succinate ester from Munzing, GmbH |
| Mowiol ® 4/98 | Poly(vinyl alcohol) from Kuraray having 2% acetate groups |
| Mowiol ® 4/88 | Poly(vinyl alcohol) from Kuraray having 12% acetate groups |
| NK Ester BPE-500 | Ethoxylated bisphenol A having methacrylic end groups, that is available from Shin Nakamura (Japan) |
| Polymer P1 | Copolymer derived from benzyl methacrylate, N-isopropyl methacrylamide, allyl methacrylate, and methacrylic acid (weight-% ratio of 27:20:39:13) |
| Inhibitor 1 | N-Nitrosophenylhydroxylamine, aluminum salt |
| Inhibitor 2 | Phenyl-t-butylnitron |
| Inhibitor 3 | Tris-t-butyl-nitrosoebenzene |
| PVI | Poly(vinyl imidazole) |
| PVP K15 | Poly(vinyl pyrrolidone) from ISP |
| S1 | 2-Phenyl-4-(2-chlorophenyl)-5-(4-diethylaminophenyl)-oxazole |
| Surfynol ® 440 | 2,4,7,9-Tetramethyl decin-4,7-diol ethoxylated with 3.5 mol EO units from Air Products (USA) (Allentown, PA) |

Invention Examples 1-11 and Comparative Examples 1-10

Lithographic Substrate

An electrochemically roughened and anodized aluminum foil with an oxide weight of 3 g/m$^2$ was subjected to a treatment using an aqueous solution of poly(vinyl phosphoric acid). The average roughness of the surface was 0.55 µm.

Imageable Layer Application:

Imageable layer coating compositions described below in TABLE I and II were applied to the substrate after filtering with a wire bar coater. The coatings were dried for 4 minutes at 90° C. The coating weights were 1.6 g/m$^2$ for the formulations sensitized at 405 nm (TABLE I) and 1.4 g/m$^2$ for the formulation sensitized at 810 to 830 nm (TABLE II).

Topcoat Layer Application:

The imageable layers were then overcoated with aqueous solutions described in TABLE III with a wire bar coater to provide topcoat layers each having a dry coating weight after drying for 4 minutes at 90° C. of 2.2 g/m$^2$ for the formulations sensitized at 405 nm (TABLE I) and 2 g/m$^2$ for the formulation sensitized at 810 to 830 nm (TABLE II).

Exposure of 405 nm Sensitive Photopolymer Plates:

The resulting imageable elements of Invention Examples 1 to 4 and Comparative Examples 1 to 6 were exposed using an imagesetter (Andromeda® A750M from Lithotech) that was equipped with a laser diode emitting at 405 nm (P=30 mW). An UGRA gray scale V2.4 with defined tonal values (all data were linearized in order to approximately obtain the desired tonal value) was used as the image. The imaged elements were heated directly after exposure for 2 minutes to 90° C. After washing off the water-soluble topcoat with water, the imaged elements were developed using Kodak Violet 500

Developer. The sensitivity of the imageable elements was determined using an UGRA Offset test scale 1982 with overall flood exposure using the platesetter disclosed above. The "exposure energy" is defined as the energy needed in order to obtain two gray scale steps of an UGRA scale of the developed printing plate. The room conditions for exposing and processing the plates were 22° C. and 40% relative humidity. The printing plate precursors were preheated and developed immediately after exposure. The results are shown below in TABLE IV.

Exposure of 830 nm Sensitive Photopolymer Plates:

The UGRA/FOGRA Postscript Strip version 2.0 EPS (available from UGRA), which contains different elements for evaluating the quality of the copies, was used for imaging the elements of Invention Examples 5 to 11 and Comparative Examples 7 to 10 using a Kodak® Trendsetter 3244 platesetter (830 nm). The sensitivity (photospeed) of the imageable elements exposed at 830 nm was evaluated by exposing the plate with different energies. The exposed printing plate precursors were heated directly after exposure for 2 minutes to 90° C. and than developed using Developer Kodak 1080. The minimum energy having the lowest deviation of the target tonal values compared to the measured tonal value of the developed printing plate is defined as the "exposure energy". The room conditions for exposing and processing the plates were 22° C. and 40% relative humidity. The printing plate precursors were preheated and immediately developed after exposure. The results are shown in TABLE IV below.

Developability:

To evaluate developability, unexposed 5 cm×30 cm plate strips were heated in an oven for 2 minutes at 90° C., the topcoat layer was washed off and the strip was dried. The strips were then immersed gradually in the various developers such that every 5 seconds 4 cm more were immersed in the developer bath. After a total dwell time of 50 seconds, the strips were removed from the developer bath and the developing time was determined as the time necessary to completely remove the coating. The results can be inferred from Table IV below.

Accelerated Aging:

To simulate aging, a wrapped stack of plates were stored in an oven for 16 hours at 60° C. The exposure, processing, and evaluation of developability were determined as described above. From these data, an overall assessment was made using following scale: 1=very good, 2=good, 3=sufficient, 4=bad and 5=very bad. The results are shown below in TABLE IV.

Latent Image Keeping:

To evaluate the latent image keeping, the samples were stored after exposure for 15 min at 24° C. and 60% relative humidity. The samples were preheated and developed as described above. The latent image keeping was considered to be "good" if the tonal value of the 50% tint at 200 lpi of the treated sample was not more than 3% smaller compared to the sample processed directly after exposure without storing it for 15 minutes at 60% relative humidity. In the case the tonal value of the 50% tint at 200 lpi of the treated sample was more than 3% smaller compared to the sample processed directly after exposure without storing it for 15 minutes at 60% relative humidity, the latent image keeping was considered to be "bad". The results are shown below in TABLE IV.

CONCLUSIONS

Invention Examples 1 to 11 show that good shelf life and good latent image keeping were obtained with imageable elements having a topcoat layer containing a poly(vinyl alcohol) having a low acetate content (2%) and containing both anaerobic and aerobic free radical inhibitors according to this invention.

Comparative Examples 1 to 3 and 5 show that imageable elements having good shelf life and having only an aerobic inhibitor can be realized only by using a topcoat layer comprising a poly(vinyl alcohol) having a high acetate content (12%) that allows enough oxygen penetration during storage. These elements did not have sufficient latent image keeping.

Where topcoat layers comprising a poly(vinyl alcohol) with low acetate content were used in combination with aerobic inhibitors alone, poor shelf life and slow developability resulted (Comparative Examples 4 and 7). Also, poor shelf life and slow developability were observed when only an anaerobic inhibitor was used in combination with a topcoat layer having a poly(vinyl alcohol) having low acetate content (Comparative Examples 5, 6, and 9).

Comparative Examples 1 to 3, 8, and 11 demonstrate that the use of poly(vinyl alcohol) having a high acetate content in the topcoat layer provides imageable elements with insufficient latent image keeping.

Comparative Example 10 was carried out following the teaching of EP 1,849,836A1. It contained a topcoat layer having a mixture of high and low saponified poly(vinyl alcohol)s having an average saponification degree that was >93%. The shelf life of such imageable elements having such topcoat layers in combination with only an aerobic inhibitor was not sufficient.

TABLE I

Composition of 405 nm sensitive photopolymer layer

| | |
|---|---|
| 1.81 g | Polymeric binder P1 |
| 1.89 g | Dispersion in propylene glycol monomethyl ether containing 9 wt. % of copper phthalocyanine and 1 wt. % of a poly(vinyl acetal) binder containing 39.9 mol % vinyl alcohol, 1.2 mol % vinyl acetate, 15.4 mol % acetal groups from acetaldehyde, 36.1 mol % acetal groups from butyraldehyde, and 7.4 acetal groups from 4-formylbenzoic acid |
| 0.7 g | Sensitizer S1 |
| 0.05 g | Kayamer PM-2 |
| 7.1 g | Solution of 30 weight % in methyl ethyl ketone of an oligomer made by reaction of HMDI + HEMA + HEPi |
| 0.37 g | NK Ester BPE-500 |
| 0.17 g | 2,2-Bis-(2-chlorophenyl)-4,5,4',5'-tetraphenyl-2'H-[1,2']biimidazolyl |
| 0.31 g | 1H-1,2,4-triazole-5-thiol |
| X g | Anaerobic inhibitor corresponding to TABLE IV |
| Y g | Aerobic inhibitor corresponding to TABLE IV |
| 23 ml | Propylene glycol monomethyl ether |
| 12 ml | Methanol |
| 16 ml | Methyl ethyl ketone |

TABLE II

Composition of 830 nm sensitive photopolymer layer

| | |
|---|---|
| 4.26 g | Terpolymer prepared by polymerization of 470 parts by weight styrene, 336 parts by weight methyl methacrylate and 193 parts by weight methacrylic acid, as 30% solution in propylene glycol monomethylether |
| 1.26 g | Joncryl ® 683 (acrylic resin from SC Johnson & Son Inc., USA) |
| 9 g | Solution of 30 weight % in methyl ethyl ketone of an oligomer made by reaction of HMDI + HEMA + HEPi |
| 0.10 g | N-phenyliminodiacetic acid |
| 0.30 g | 2-(4-Methoxyphenyl)-4,6-trichloromethyl-1,3,5-triazine |
| 0.075 g | Basonyl Violet 610 from BASF |
| 0.021 g | Phosphoric acid (85%) |

TABLE II-continued

Composition of 830 nm sensitive photopolymer layer

| | | |
|---|---|---|
| 0.09 g | 2-[2-[2-Thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride from FEW Chemicals GmbH (Wolfen) | |
| 0.33 g | 5-(4-Vinylbenzyl)thio-1,3,4-thiadiazole-2-thiol | |
| X g | Anaerobic inhibitor corresponding to TABLE IV | |
| Y g | Aerobic inhibitor corresponding to TABLE IV | |
| 30 ml | Propylene glycol monomethylether | |
| 3 ml | Acetone | |

TABLE III

Compositions of Topcoat Layer ("OC") Solutions

| | OC1 | OC2 | OC3 | OC4 | OC5 | OC6 | OC7 |
|---|---|---|---|---|---|---|---|
| Mowiol ® 4/98 | 89% | 84% | 79% | | | | 21% |
| Mowiol ® 4/88 | | | | 89% | 84% | 79% | 63% |
| PVP K15 | 10% | | 20% | 10% | | 20% | 15% |
| PVI | | 15% | | | 15% | | |
| Metolat ® 285 | 1% | | | 1% | | | 1% |
| Surfynol ® 440 | | 1% | | | 1% | | |
| Lutensol ® T010 | | | 1% | | | 1% | |
| Water | to make a 10% solution | | | | | | |

TABLE IV

| | Imageable Layer | Exposure Wavelength | Topcoat Layer | X g Anaerobic Inhibitor | Y g Aerobic Inhibitor | Exposure Energy | Developing Time | Accelerated Ageing Test | Latent Image keeping |
|---|---|---|---|---|---|---|---|---|---|
| Invention Example 1 | TABLE I | 405 nm | OC1 | 0.027 g Inhibitor 1 | 0.0012 g BHT | 45 µJ/cm$^2$ | 10 sec | 2 | good |
| Invention Example 2 | TABLE I | 405 nm | OC2 | 0.027 g Inhibitor 1 | 0.0012 g MEHQ | 45 µJ/cm$^2$ | 10 sec | 2 | good |
| Invention Example 3 | TABLE I | 405 nm | OC3 | 0.027 g Inhibitor 1 | 0.0012 g BHT | 45 µJ/cm$^2$ | 10 sec | 1 | good |
| Invention Example 4 | TABLE I | 405 nm | OC1 | 0.1 g Inhibitor 2 | 0.0012 g BHT | 45 µJ/cm$^2$ | 10 sec | 2 | good |
| Invention Example 5 | TABLE II | 830 nm | OC1 | 0.027 g Inhibitor 1 | 0.0012 g BHT | 75 mJ/cm$^2$ | 5 sec | 1 | good |
| Invention Example 6 | TABLE I | 830 nm | OC2 | 0.027 g Inhibitor 1 | 0.0012 g MEHQ | 75 mJ/cm$^2$ | 5 sec | 1 | good |
| Invention Example 7 | TABLE II | 830 nm | OC3 | 0.027 g Inhibitor 1 | 0.0012 g BHT | 75 mJ/cm$^2$ | 5 sec | 1 | good |
| Invention Example 8 | TABLE II | 830 nm | OC1 | 0.1 g Inhibitor 2 | 0.0012 g BHT | 75 mJ/cm$^2$ | 5 sec | 1 | good |
| Invention Example 9 | TABLE II | 830 nm | OC1 | 0.1 g Inhibitor 3 | 0.0012 g BHT | 75 mJ/cm$^2$ | 5 sec | 1 | good |
| Invention Example 10 | TABLE II | 830 nm | OC1 | 0.01 g Inhibitor 1 + 0.065 g Inhibitor 2 | 0.0012 g BHT | 75 mJ/cm$^2$ | 5 sec | 1 | good |
| Invention Example 11 | TABLE II | 830 nm | OC1 | 0.01 g Inhibitor 1 + 0.065 g Inhibitor 3 | 0.0012 g BHT | 75 mJ/cm$^2$ | 5 sec | 1 | good |
| Comparative Example 1 | TABLE I | 405 nm | OC4 | — | 0.0012 g BHT | 45 µJ/cm$^2$ | 10 sec | 1 | bad |
| Comparative Example 2 | TABLE I | 405 nm | OC5 | — | 0.0012 g MEHQ | 45 µJ/cm$^2$ | 10 sec | 1 | bad |
| Comparative Example 3 | TABLE I | 405 nm | OC6 | — | 0.0012 g BHT | 45 µJ/cm$^2$ | 10 sec | 1 | bad |
| Comparative Example 4 | TABLE I | 405 nm | OC1 | — | 0.0012 g BHT | 45 µJ/cm$^2$ | >25 sec | 5 | good |
| Comparative Example 5 | TABLE I | 405 nm | OC1 | 0.027 g Inhibitor 1 | — | 45 µJ/cm$^2$ | >25 sec | 4 | good |
| Comparative Example 6 | TABLE I | 405 nm | OC1 | 0.1 g Inhibitor 2 | — | 45 µJ/cm$^2$ | >25 sec | 4 | good |
| Comparative Example 7 | TABLE II | 830 nm | OC1 | — | 0.0012 g BHT | 75 mJ/cm$^2$ | >25 sec | 5 | good |
| Comparative Example 8 | TABLE I | 830 nm | OC5 | — | 0.0012 g BHT | 75 mJ/cm$^2$ | 5 sec | 1 | bad |
| Comparative Example 9 | TABLE II | 830 nm | OC1 | 0.027 g Inhibitor 1 | — | 75 mJ/cm$^2$ | >25 sec | 5 | good |
| Comparative Example 10 | TABLE I | 405 nm | OC7 | — | 0.0012 g BHT | 45 µJ/cm$^2$ | 20 sec | 3 | good |
| Comparative Example 11 | TABLE I | 405 nm | OC4 | 0.027 g Inhibitor 1 | — | 45 µJ/cm$^2$ | 10 sec | 2 | bad |

The invention has been described in detail with particular reference to certain preferred embodiments thereof, but it will be understood that variations and modifications can be effected within the spirit and scope of the invention.

The invention claimed is:

1. A negative-working imageable element that is a negative-working lithographic printing plate precursor comprising an aluminum-containing substrate and having thereon an imageable layer comprising:
a free-radically polymerizable component,
an initiator composition that is capable of generating free radicals sufficient to initiate polymerization of said free-radically polymerizable component upon exposure to imaging radiation in the presence of a radiation absorbing compound,
a radiation absorbing compound,
optionally a polymeric binder that is not a free radically polymerizable component,
an aerobic free radical inhibitor, and
an anaerobic free radical inhibitor that is a C- or N-nitroso compound, N-oxide, or hydroxylamine derivative, wherein the N-oxide is selected from the group consisting of 5,5-dimethyl-1-pyrroline N-oxide, α-(4-pyridyl N-oxide)-N-t-butylnitrone, N-t-butyl-α-phenylnitrone, and 3,3,5,5-tetramethyl-1-pyrroline N-oxide,
wherein the molar ratio of said anaerobic free radical inhibitor to said aerobic free radical inhibitor is at least 1:1.

2. The element of claim 1 wherein said aerobic free radical inhibitor is a non-polymeric phenolic compound.

3. The element of claim 1 wherein said aerobic free radical inhibitor and said anaerobic free radical inhibitor are independently present in an amount of from about 0.001 to about 2 weight %, based on imageable layer dry weight, and the molar ratio of said anaerobic free radical inhibitor to said aerobic free radical inhibitor is greater than 1:1 and up to 200:1.

4. The element of claim 1 wherein said free radically polymerizable component is a polymeric binder or includes a mixture of a free radically polymerizable polymeric binder and a free radically polymerizable monomer or oligomer.

5. The element of claim 1 wherein said free radically polymerizable component is not a polymeric binder, and said composition further comprises a polymeric binder that is not a free radically polymerizable component.

6. The element of claim 1 wherein said radiation absorbing compound has a $\lambda_{max}$ of either from about 250 to about 475 nm, or from about 700 to about 1400 nm.

7. The element of claim 1 further comprising a topcoat layer disposed on said imageable layer.

8. The element of claim 7 wherein said topcoat layer comprises a poly(vinyl alcohol) having a degree of hydrolysis of at least 85%.

9. The element of claim 7 wherein said topcoat layer further comprises a polymeric adhesion promoter.

10. The element of claim 9 wherein said topcoat layer further comprises poly(vinyl pyrrolidone), a copolymer derived from vinyl pyrrolidone, poly(vinyl imidazole), a copolymer derived from vinyl imidazole, or a poly(ethyleneimine) in an amount of from about 5 to about 40% based on the total topcoat layer dry weight.

11. The element of claim 1 that is an on-press developable lithographic printing plate precursor.

12. A method of making an image comprising:
A) imagewise exposing the negative-working imageable element of claim 1 to imaging radiation to provide both exposed and non-exposed regions in the imageable layer, and
B) applying a processing solution to said imaged element to remove predominantly only said non-exposed regions.

13. The method of claim 12 wherein said processing is carried out off-press.

14. The method of claim 12 wherein said imaging radiation is at from about 700 to about 1400.

15. The method of claim 12 further comprising using said imaged and processed element for printing using a lithographic printing ink.

16. The method of claim 12 wherein said processing is carried out on-press.

17. The element of claim 1 wherein the anaerobic free radical inhibitor is a C- or N-nitroso compound or a hydroxylamine derivative.

18. The element of claim 1 wherein the anaerobic free radical inhibitor is an N-oxide that is selected from the group consisting of 5,5-dimethyl-1-pyrroline N-oxide, α-(4-pyridyl N-oxide)-N-t-butylnitrone, N-t-butyl-α-phenylnitrone, and 3,3,5,5-tetramethyl-1-pyrroline N-oxide.

* * * * *